United States Patent
Grau

(10) Patent No.: US 11,341,295 B2
(45) Date of Patent: May 24, 2022

(54) METHODS, SYSTEMS, AND DEVICES FOR EFFICIENT COMPUTATION OF SIMULATION RUNS

(71) Applicant: Intel Corporation, Santa Clara, CA (US)

(72) Inventor: Oliver Grau, Voelklingen (DE)

(73) Assignee: INTEL CORPORATION, Santa Clara, CA (US)

(*) Notice: Subject to any disclaimer, the term of this patent is extended or adjusted under 35 U.S.C. 154(b) by 636 days.

(21) Appl. No.: 16/143,516

(22) Filed: Sep. 27, 2018

(65) Prior Publication Data

US 2019/0050512 A1 Feb. 14, 2019

(51) Int. Cl.
| | |
|---|---|
| *B60W 20/10* | (2016.01) |
| *G06F 30/20* | (2020.01) |
| *G06F 9/48* | (2006.01) |
| *G06F 16/901* | (2019.01) |
| *G06F 30/15* | (2020.01) |
| *G06F 9/455* | (2018.01) |

(52) U.S. Cl.
CPC ............ *G06F 30/20* (2020.01); *G06F 9/4843* (2013.01); *G06F 16/9024* (2019.01); *G06F 30/15* (2020.01); *G06F 9/45558* (2013.01); *G06F 2009/45575* (2013.01)

(58) Field of Classification Search
CPC ...... G06F 30/20; G06F 16/9024; G06F 30/15; G06F 9/4843; G06F 9/45558; G06F 2009/45575
See application file for complete search history.

(56) References Cited

U.S. PATENT DOCUMENTS

| | | | |
|---|---|---|---|
| 2009/0177602 A1* | 7/2009 | Ning | B60K 28/02 706/21 |
| 2018/0128634 A1* | 5/2018 | Nakamura | G01C 21/3679 |
| 2018/0128635 A1* | 5/2018 | Nakamura | B60W 30/12 |
| 2018/0183873 A1* | 6/2018 | Wang | H04L 67/02 |
| 2019/0146492 A1* | 5/2019 | Phillips | G09B 19/16 701/23 |
| 2019/0303759 A1* | 10/2019 | Farabet | G06N 3/08 |

* cited by examiner

*Primary Examiner* — Doon Y Chow
*Assistant Examiner* — Abdou K Seye
(74) *Attorney, Agent, or Firm* — Viering, Jentschura & Partner MBB

(57) ABSTRACT

Methods, systems, and apparatus, including computer programs encoded on non-transitory computer storage medium(s), for efficiently executing autonomous driving (AD) simulations. The AD simulation can include segmented time events that include variations. The simulation including its variations can be implemented as a graph structure in which the simulation may be executed in a manner similar to traversing a graph.

19 Claims, 10 Drawing Sheets

METHODS, SYSTEMS, AND DEVICES FOR EFFICIENT COMPUTATION OF SIMULATION RUNS

TECHNICAL FIELD

Various embodiments generally relate to methods, systems, and devices for efficiently executing autonomous driving simulations.

BACKGROUND

Embedded systems in automotive or autonomous environments have very high safety requirements. For evaluation, it is required to test the embedded system with a high amount of test scenarios. For autonomous driving (AD) assumptions vary, but estimate that an AD car needs to be tested with millions of km and some models even estimate up to $10^9$ km. The assumption is that this amount of mileage can only be tested in simulation. The validation of every major software and hardware release with simulated and captured sensor data requires a massive parallel deployment of the evaluation system in data centers (or high-performance clusters).

One strategy would be to sample the test space and expand around important set-ups, like dangerous traffic hotspots. The tests will be set-up with static components, like the road+environment and actors (or agents) including the AD system under test. Parameters of the actors will be varied. A variation could be the speed of a simulated car entering a scene and the time when it accelerates or time of the appearance of pedestrians.

However, there is a lot of redundancy in the scenario variations, that means the same scene content (static and actors) needs to be loaded again and again for the simulation runs. Moreover, variations may occur in the middle or end of the simulation run. A full run would replicate a lot of operations to until a branch point will be reached and different variants will be followed.

SUMMARY

According to one or more exemplary embodiments of the present disclosure, a method for simulating autonomous driving includes obtaining at an autonomous driving (AD) simulation system comprising one or more processors operatively coupled to one another, scenario simulation data and simulation test data, the simulation test data defining a plurality of segmented time events; executing, by the AD simulation system, an initial simulation session sequentially from a starting point defined by the obtained scenario simulation data and simulation data test; detecting, by the AD simulation system, a branching point, the branching point occurring in the initial simulation session before execution of a branching time event that includes a parameter having a plurality of discrete variations, storing, before execution of the detected branching time event, a current state of the initial simulation session as a parent graph node; and executing, by the AD simulation system, a separate branched simulation session starting from the stored current state of the initial simulation using a first variation of the plurality of the discrete variations for the parameter of the branching time event.

According to one or more exemplary embodiments of the present disclosure, a method for executing simulated autonomous driving comprises: obtaining, at an autonomous driving (AD) simulation system comprising one or more processors operatively coupled to one another, a simulation state, the simulation state stored as node linking to one or more other AD simulation states stored as nodes; executing, by the AD simulation system, a simulation session from the obtained simulation state; detecting, by the AD simulation system, a branching point, the branching point occurring in the current simulation session before execution of a branching time event including a parameter having a plurality of discrete variations, storing, by the AD simulation system, before execution of the detected branching time event, a current state of the current simulation session as a graph node linked with the obtained simulation state; determining, by the AD simulation system, a next simulation state from which to execute a further simulation session; obtaining, by the AD simulation system, the simulation state at the determined graph node, the simulation state including a branching time event with a plurality of variations of a parameter; executing, by the AD simulation system, a further simulation session from the determined simulation state using a selected parameter variation.

According to one or more exemplary embodiments of the present disclosure, an autonomous driving (AD) simulation system includes one or more processors and a memory storing instructions that, when executed by the one or more processors, cause the one or more processors to: obtain a stored AD simulation state, the simulation state stored as a graph node linked to one or more other simulation states stored as other graph nodes; execute a current AD simulation session from the obtained simulation state; detect a branching point, the branching point occurring in the current AD simulation session before execution of a branching time event including a parameter having a plurality of discrete variations, store, before execution of the detected branching time event, a current state of the current simulation session as a graph node linked with the obtained simulation state; determine a next simulation state from which to execute another simulation session; obtain the simulation state at the determined graph node, the simulation state including a branching time event with a plurality of variations of a parameter; execute a further AD simulation session from the determined simulation state using a selected parameter variation.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
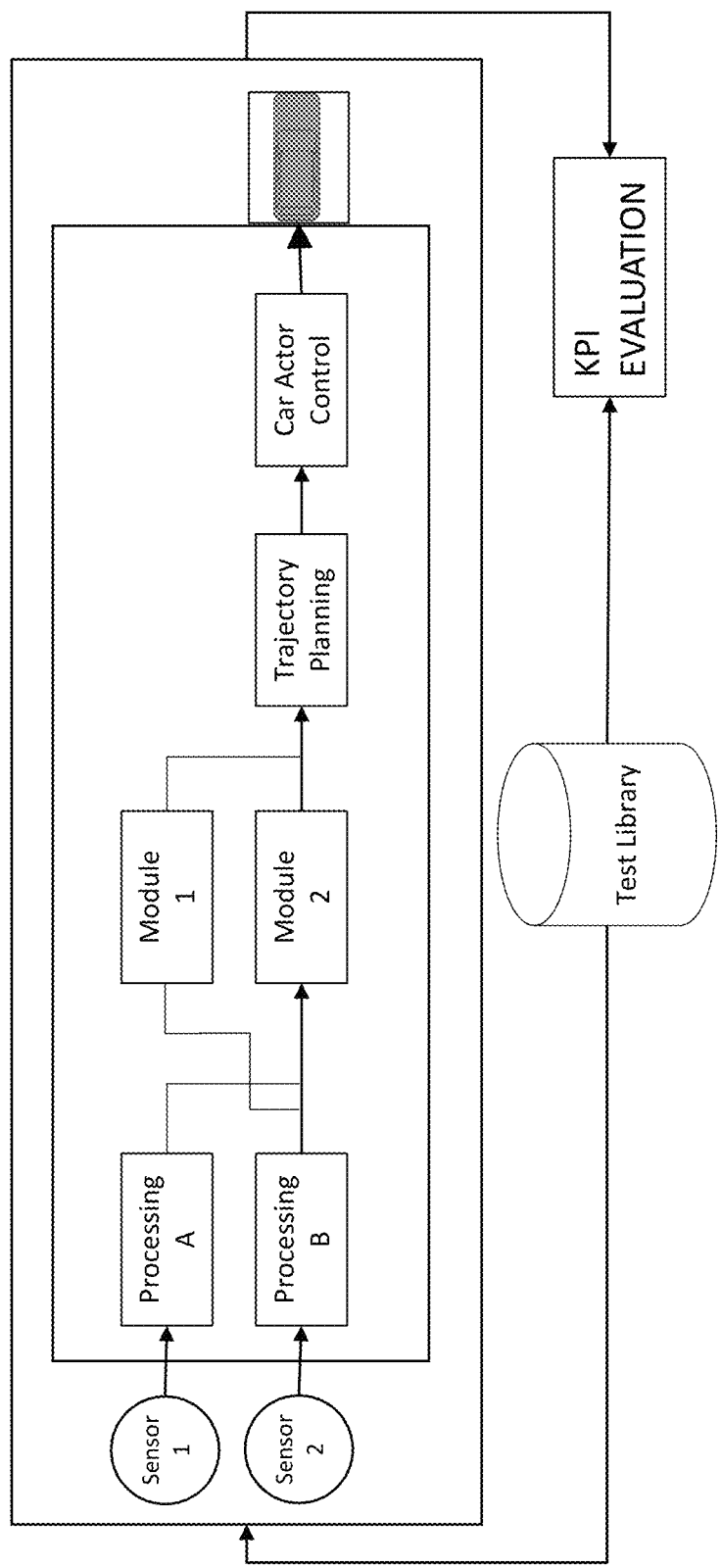
FIG. 1 illustrates an exemplary autonomous driving systems in accordance with or implemented in exemplary embodiments of the present disclosure.

The following detailed description refers to the accompanying drawings that show, by way of illustration, specific details and embodiments in which the invention may be practiced.

The word "exemplary" is used herein to mean "serving as an example, instance, or illustration." Any embodiment or design described herein as "exemplary" is not necessarily to be construed as preferred or advantageous over other embodiments or designs.

Various embodiments of the present disclosure are directed toward efficient processing of autonomous driving (AD) simulations by avoiding execution of redundant simulation segments. In other words, it may be desired to keep computational effort to a minimum. The present disclosure includes various exemplary embodiments describing graph-based approaches to AD simulations which are configured to save a significant amount of computations in cases where a simulation includes a sequence of parameter variations. The graph-based approach reduces redundant paths from requiring exponential effort to only needing a linear effort. The various embodiments herein may be combined with any traffic simulation program in order to compute the simulation faster or more efficiently on existing hardware.

Various embodiments of the present disclosure, including exemplary functional operations described in this disclosure, can be implemented in digital electronic circuitry, in tangibly-embodied computer software or firmware, in computer hardware, including the structures disclosed in this specification and their structural equivalents, or in combinations of one or more of them. That is, various embodiments of the present disclosure may be implemented as one or more computer programs, i.e., one or more modules of computer program instructions encoded on a tangible-non transitory computer readable medium for execution by, or to control the operation of, data processing apparatus.

A computer program (which may also be referred to or described as a program, software, a software application, a module, a software module, a script, or code) can be written in any form of programming language, including compiled or interpreted languages, or declarative or procedural languages, and it can be deployed in any form, including as a stand-alone program or as a module, component, subroutine, or another unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, subprograms, or portions of code. A computer program can be deployed to be executed on one computer or on multiple computers that are located at one site or distributed across multiple locations and interconnected by a communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Computers suitable for the execution of a computer program include, by way of example, can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer may also be operatively configured coupled to receive data from or transfer data to, or both, one or more mass storage devices for storing data, e.g., magnetic, magneto-optical disks, or optical disks. However, a computer need not have such devices. Moreover, a computer can be embedded in another suitable device, e.g., a smartphone, a tablet device, a Global Positioning System (GPS) receiver, or a portable storage device, e.g., a universal serial bus (USB) flash drive, to name just a few.

Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD ROM and DVD-ROM disks. The processor and the memory can be supplemented by, or incorporated in, special purpose logic circuitry.

As used herein, "memory" are understood as a non-transitory computer-readable medium in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, etc., or any combination thereof. Furthermore, registers, shift registers, processor registers, data buffers, etc., are also embraced herein by the term memory. A single component referred to as "memory" or "a memory" may be composed of more than one different type of memory, and thus may refer to a collective component comprising one or more types of memory. Any single memory component may be separated into multiple collectively equivalent memory components, and vice versa. Furthermore, while memory may be depicted as separate from one or more other components (such as in the drawings), memory may also be integrated with other components, such as on a common integrated chip or a controller with an embedded memory.

The term "software" refers to any type of executable instruction, including firmware.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by computer programs running on the respective computers and having a client-server relationship to each other.

Also, various program programs, instructions, code, or functionality described herein been identified based upon an application or software component within which it is implemented in a specific embodiment of the invention. However, it should be appreciated that any particular program nomenclature is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers (e.g., operating systems, libraries, APIs, applications, applets, etc.), it should be appreciated that the invention is not limited to the specific organization and allocation of program functionality described herein.

Thus, the invention in its broader aspects is not limited to the specific details representative apparatus and method, and illustrative examples shown and described.

FIG. 1 shows a diagram showing an overview how an AD simulation system, which is described in detail in *Autonomous driving: Safer and More Efficient Future Driving* 1st ed., Watzenig, Daniel, ed. Sep. 24, 2016, Springer. See pages 442 for a description of validation/testing methodology. The system such as FIG. 1, or another system may simulate one or more simulated driving scenario, for example, the driving scenario shown in FIG. 2.

Figure 2:
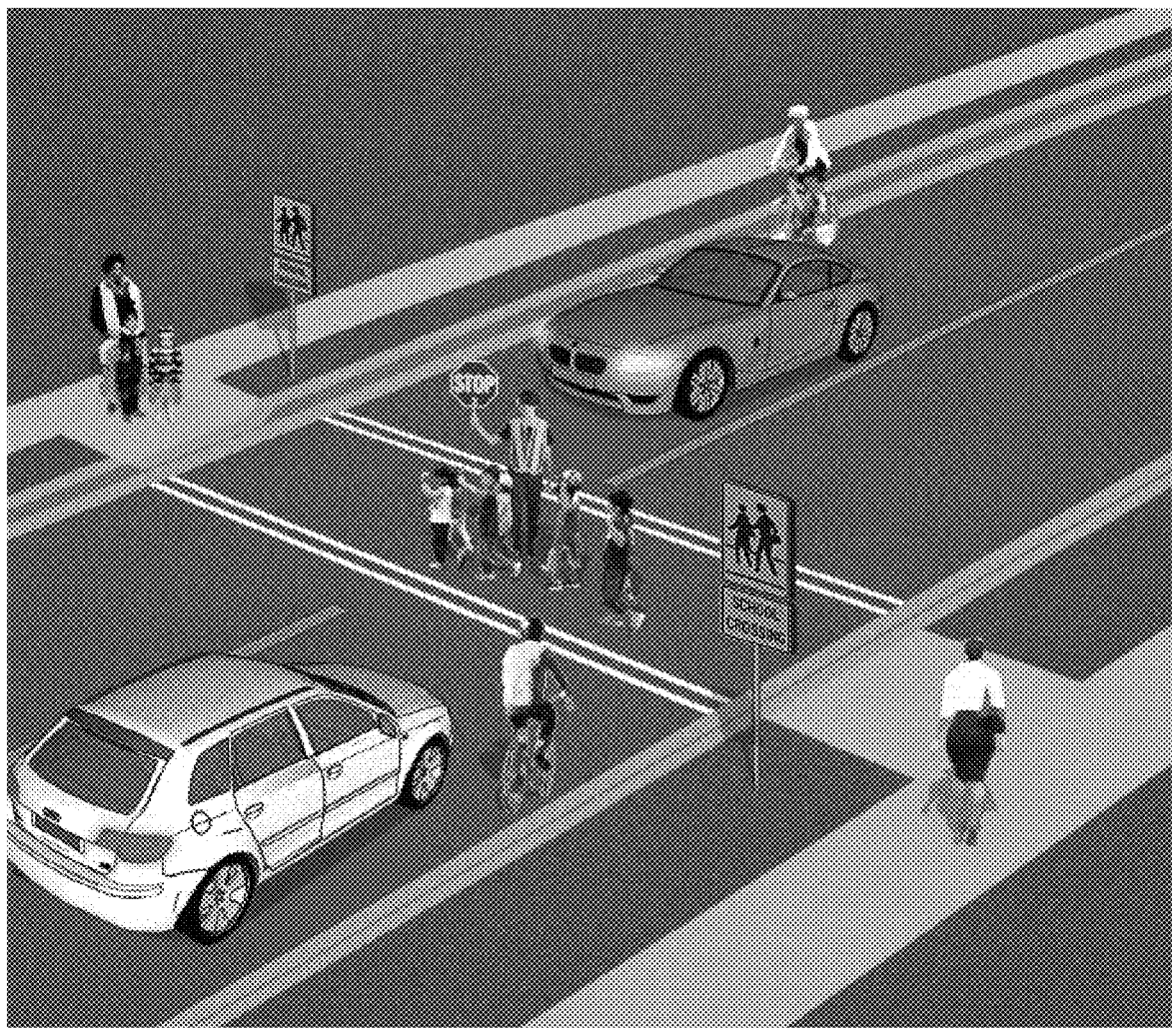
FIG. 2 illustrates an exemplary simulated traffic scene in accordance with or implemented exemplary embodiments of the present disclosure.

FIG. 2 depicts an exemplary simulation scenario. A simulation may be set-up using this simulation scenario. In exemplary embodiments, but the test data can define simulation parameters to be executed or simulated. Further, in some embodiments, one or more parameters may be defined with some variations for various conditions or events. In one example, the data sets may describe multiple variations of time, speed, style of a pedestrian walking (e.g., crossing a road), etc.

A typical test scenario in a simulation involves the AD system under test to drive to get to a target destination. It is expected that the AD system reacts on certain obstacles and dynamic objects, like other vehicles and humans and changes the route automatically. For systematic tests, dynamic components can be implemented as animations in a graphical simulation engine, using, for example, standard graphics techniques, like games engines or other real-time and offline graphics systems. Each animation may be handled as an event with a start and end time (e.g., see FIG. 6). Further, animations can be parameterized. Examples are: the start time $t_s$ of the event, the speed v, direction, position, and so on. For simulation tests these parameters can be sampled into a sequence of discrete variations of the parameters, for example for start time t: {t,t',t'',t''' . . . ).

For each parameter, a set of variations can be created for testing. That is in a simulation or the test, as objects, each with various parameters than can be varied, are added to a scene or simulation, then to execute each required variation sequence the required computational effort all the possible permutations will increase.

Figure 3:
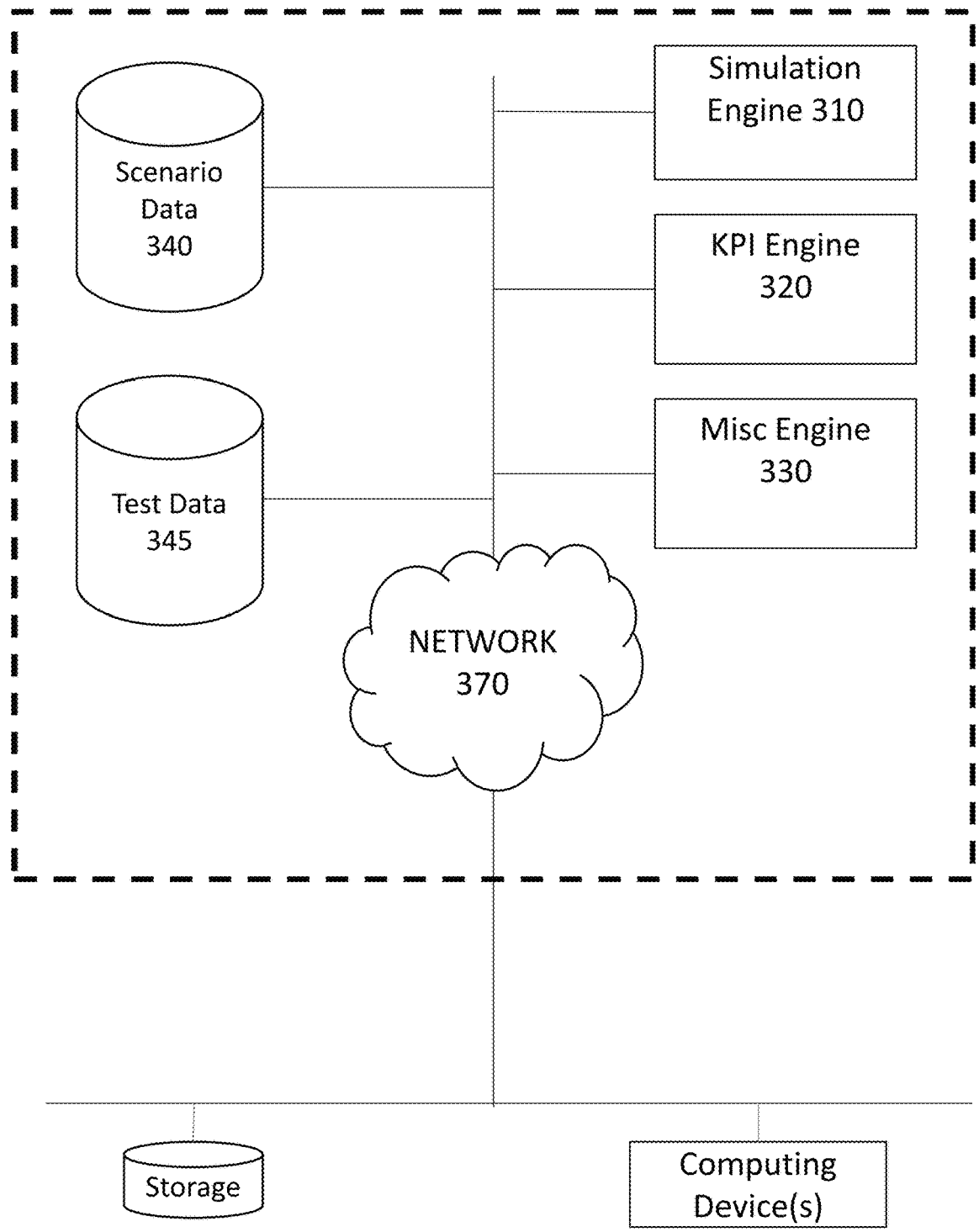
FIG. 3 illustrates an exemplary an exemplary autonomous driving simulation system in accordance with or implemented in exemplary embodiments of the present disclosure.

FIG. 3 shows an exemplary autonomous driving simulation system 300 that may execute or perform simulations and/or related actions in accordance with embodiments described herein. The AD simulation system 300 may include a simulation engine 310 that be one or computer apparatuses operatively coupled to each other, e.g., including one or a plurality of processors configured to execute program instructions so as to be configured to perform an AD simulation.

The simulation engine 300 include not only one or more computing devices but program instructions configured to execute the simulation. In general, the simulation run by the simulation engine may include the components needed to control or operate a simulated motor vehicle.

The simulation may be performed by the simulation engine 310 using a virtual machine. Using a virtual machine would increase the control possible over the scheduling of variants of the simulation (even over multiple machines) and avoid e.g. resource bottlenecks.

In such a case, the simulation system 300 or simulation engine 310 may implement virtualized simulations or simulation sessions. A virtual machine may function as a self-contained computing environment on or more computing devices. For example, a virtual machine may be hosted (e.g., virtualized by a hypervisor, such as a virtual machine management console) using virtual machine data (e.g., virtual machine configuration data and/or one or more virtual machine disks). The virtual machine data may be stored according to a virtual machine layout.

In exemplary embodiments, simulation information, the simulation states or nodes may be stored at one or more locations. The simulation states may be stored locally and/or remotely). Similarly, the simulation engine 310 may include one or more computing devices that are implemented locally or remotely. Data may be communicated between computing devices, storage devices, and the like through network 370.

In exemplary embodiments, FIG. 3 may include storage systems, e.g., one or more databases for both simulation scenario data 340 and simulation test data 345. This data may be stored in any suitable storage system (e.g., database) locally or remotely via a network connection 370. Further, the AD simulation system 300 or components thereof may be operatively connected to further components, e.g., storage or computing devices via the network 370. The simulation scenario data 340 may be video, image, and/or animation used to simulate various test scenario in a simulation.

Additionally, in exemplary embodiments, there may be means for evaluating how a simulated AD vehicle performs in a simulation. In particular, the AD simulation system 300 may be configured to determine key performance indicators or KPIs. The AD simulation system 300 includes a KPI Engine 320. The KPI engine may include one or more computing devices (which may include the same computing devices as the simulation engine 320) that are configured to calculate KPI at various times during a simulation or simulation instance.

Finally, the AD simulation system 300 may include other components, e.g., Misc. engine 330 to perform or implement any other necessary processes for a simulation.

Figure 4:
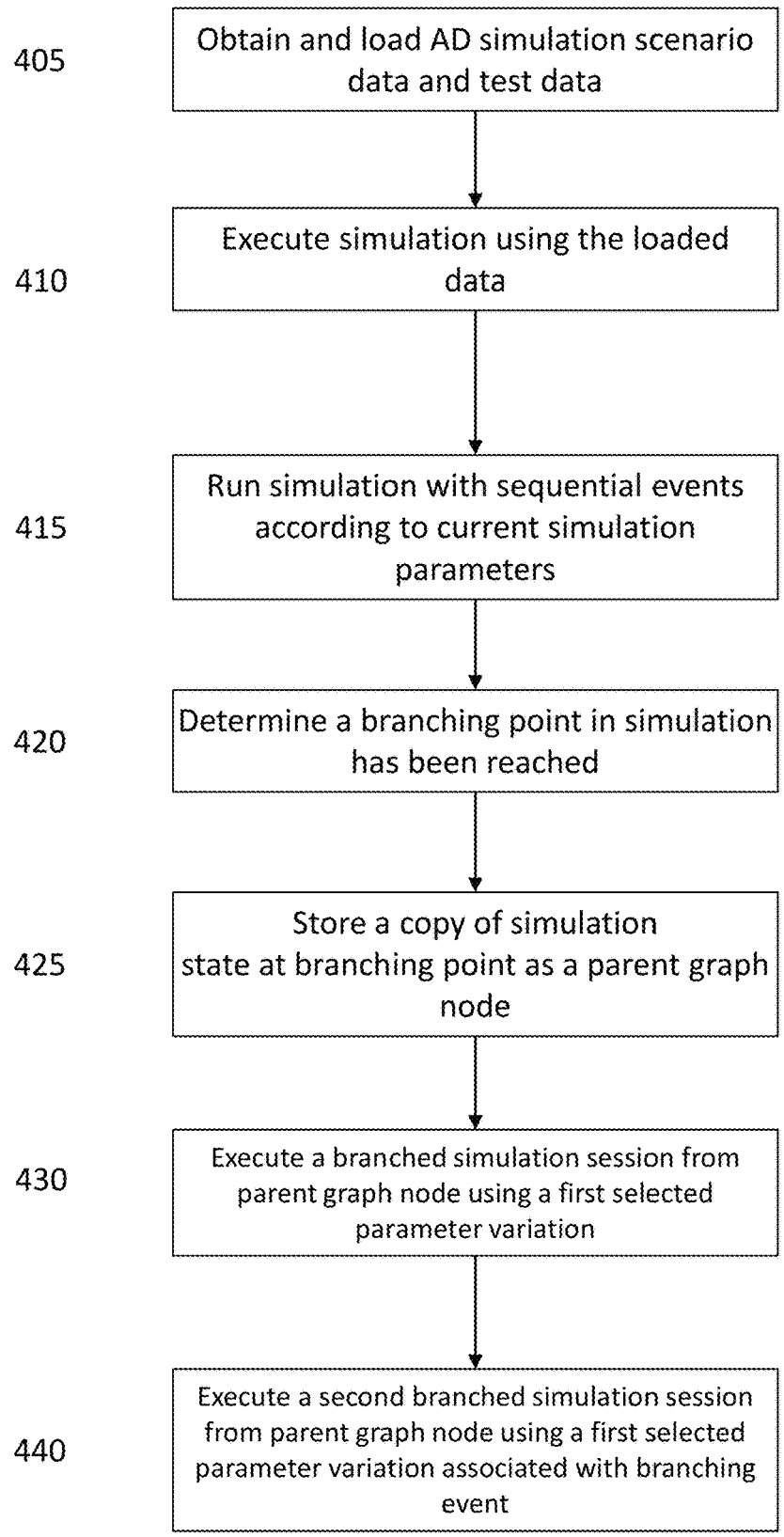
FIGS. 4-5 are exemplary flow charts describing exemplary embodiments of the present disclosure.

FIG. 4 shows, according to an exemplary embodiment of the present disclosure, a method for efficiently implementing an AD simulation system. The method includes executing an AD simulation, the AD simulation including sequential time events having various parameter variation.

At a first step, 405, an exemplary autonomous driving (AD) simulation system obtains and loading, simulation scenario data, and simulation data test sets. The simulation scenario data and data test sets may be obtained loaded into the simulation engine 300 for execution of the simulation. The simulation scenario data may include data defining or indicating the environment of the simulation. An exemplary simulation scenario is depicted in FIG. 1. In exemplary embodiments of the present disclosure, the simulated scenario data may include static and dynamic objects. In FIG. 1, a simulated auto is controlled according to the test data in a simulated environment which is a cross-walk in a school zone. Dynamic objects depicted in FIG. 1 includes motor vehicles, bicyclists, pedestrians, crossing guards, etc. In other scenarios, the scenario data may change as the environment changes during simulation. That is, one simulation may occur in traffic-dense environments, such as a city.

The test data sets for the simulation may define a plurality of segmented time events or aspects thereof. The time events may be configured by the test data to occur at various times. In other words, the test data sets may define or modify the operation of time events that occur.

At step 410, after receiving the simulation scenario data and test data sets, the AD simulation system executes an initial simulation session using the loaded simulation environmental data and simulation data test sets. That is, the AD simulation is executed sequentially from a starting point defined by the loaded simulation environmental data and simulation data test sets.

In step 415, the AD simulation system detects a branching time event associated with a plurality of discrete variations of a parameter. That is, data, such as test data 345 may define a sequence of events (e.g., actions, activities, behaviors) set to occur during a simulation at predefined times. These time events may be considered branching time events. In particular, a branching time event may include one or more parameters, and one or more of the parameters may be assigned or defined with more than one variation of a parameter. For example, data sets may define speed and motion for a particular motor vehicle existing in the simulation. Further, the data sets may define variations of a parameter, e.g., one or more speeds or one or more motion directions for a motor vehicle as one example.

Therefore, in various embodiments, the AD simulation system 300, e.g., the simulation engine 319, can detect such branching time events. The branching time events may be identified by the AD simulation system 300 in advance before the simulation begins executed or may be detected or determined during execution of the simulation.

However, these parameter variations are mutually exclusive to each, that is only one can occur at a time during one simulation. Accordingly, at step 425, the AD simulation system, before the detected time event is executed, stores a copy of the current simulation state as a graph node. In some exemplary embodiments, the stored simulation state, e.g., the stored graph node, may be stored in any storage device that is accessible to the AD simulation engine 310. The stored simulation state may include all information (e.g., files, data, etc.) needed to continue or execute the simulation from the stored copy/graph node.

In various embodiments, from each branching point, the AD simulation system 300 executes branched simulation sessions, each branched simulation session executed with a different respective parameter variation of the plurality of discrete variations of the branching time event. As such, after, the current simulation state is stored, at step 430 a branched simulation session, e.g., a first branched simulation session, starting from parent node is executed using a first selected parameter variation associated with the branching time event. The branched simulation session may be implemented or executed by the AD simulation engine separately from the initial simulation session. In some embodiments, the first branched simulation session may be implemented or executed as a continuation of the initial branch session.

In exemplary embodiments of the present disclosure, other branched simulation sessions may be executed concurrently, after or concurrently with the execution of the first branched session. In other exemplary embodiments, the AD simulation system 300 may be configured to execute additional branched simulation sessions at scheduled times or in response to individual events, e.g., simulation events.

For example, at step 440, a second branched simulation session, also starting from the parent node, may be executed by the AD simulation system 3.xx. This branched simulation session may execute from the stored graph node (initial simulation session) using a second variation of the plurality of the discrete variations of a parameter for the branching time event. In other words, the second branched simulation session runs with a second (different) selected parameter variation out of the plurality of variations.

The test data can describe or define a parameter (of an event or action) having a plurality of defined discrete variations, such as, for example, vehicle speed. In such an example test data may include or define several discrete variations of vehicle speed desired or required to be implemented in a simulation, e.g., 10 km/h, 20 km/h, 30 km/h, etc. The AD simulation system 300 may execute a first branched simulation session with a first one of the variations (or first variation) of the vehicle speed parameter (e.g., 10 km/h). Then the AD simulation system 300 may and then at some other point execute a second branched simulation with a second variation of the vehicle speed parameter (e.g., 20 km/h). Further, additional branched simulation session may be executed from this parent graph node.

Figure 5:
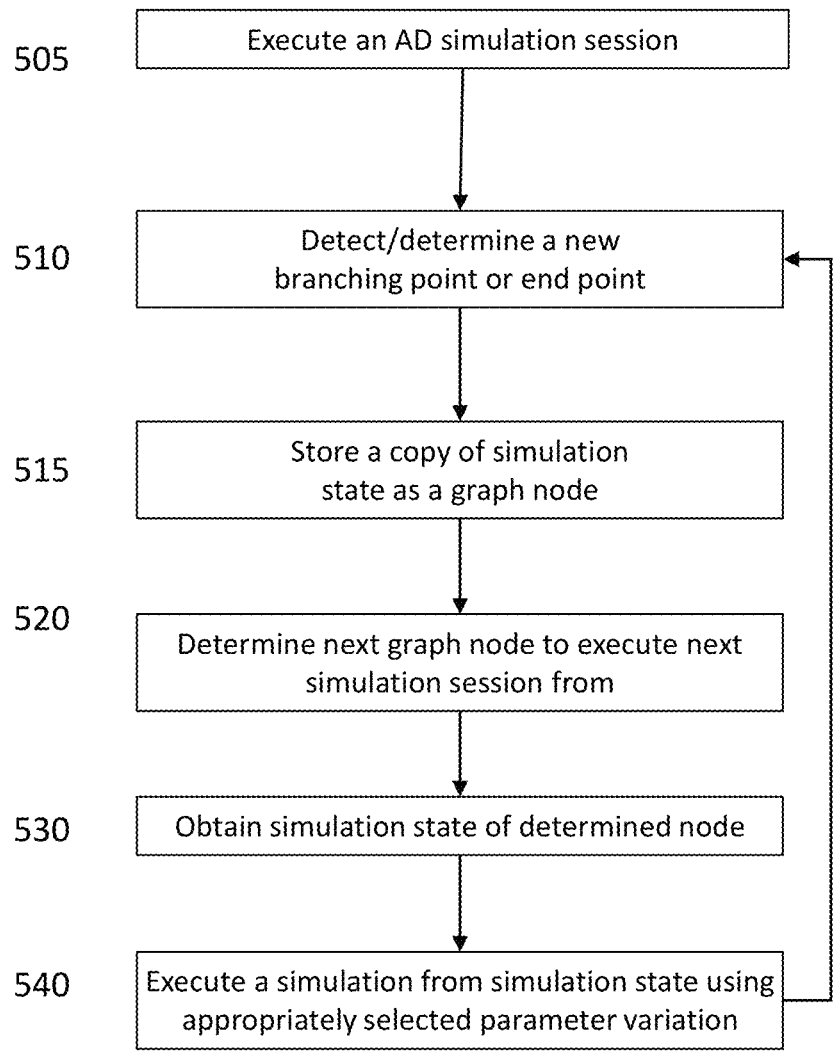

FIG. 5 shows a method for implanting an AD simulation session in accordance with one or more exemplary embodiment of the present disclosure. While FIG. 4 shows a simulation executed from a beginning, e.g., when the initial simulation scenario data and test data is obtained and/or loaded, the exemplary embodiments represented by FIG. 5 may be at any point (e.g., beginning or middle) of an AD simulation session. At step 505, an AD simulation system 300 executes a simulation session. For example, the AD simulator may execute a simulation session using currently loaded simulation scenario data and test data.

At step 510, a new branching point or end point is determined. That is, the AD simulation system 300, or the AD simulator 310, determines an upcoming branching point (determine or detect that a branching time event is to occur in the simulation). Further, the AD simulation system 300 may determine that an end point is reached or is about to be reached in the current simulation instance. At step 515, a copy of the current simulation state is stored, as a graph node. The stored graph node may be linked to a previous graph node, e.g., the node or stored simulation state from which the current simulation session began or executed from.

At step 520, the next node from which to execute a simulation session is determined. That is, the AD simulation system 300 may determine the next graph node to execute another simulation session or instance. In some circumstances, the next selected graph node may be the most recent or current saved graph node, namely the recently or saved simulation state. In other exemplary embodiments, the next selected graph node may be any other previously stored or saved graph node. The next graph node to run a further simulation session may be determined according to any suitable algorithm.

At step 530, the simulation state corresponding to the selected node is loaded. Next, at step 540, a simulation is executed from the selected simulation state (node) using an appropriately selected parameter variation. That is, the parameter variation is a parameter variation that has not been used before for that selected node. Again, the AD simulation system 300 executes a simulation session from the selected node is run as a new instance.

The simulation session may then operate or execute in the AD simulation system 300, as before, until another branching point or end point is reached or detected. In other words, the process may repeat as necessary.

Figure 6:
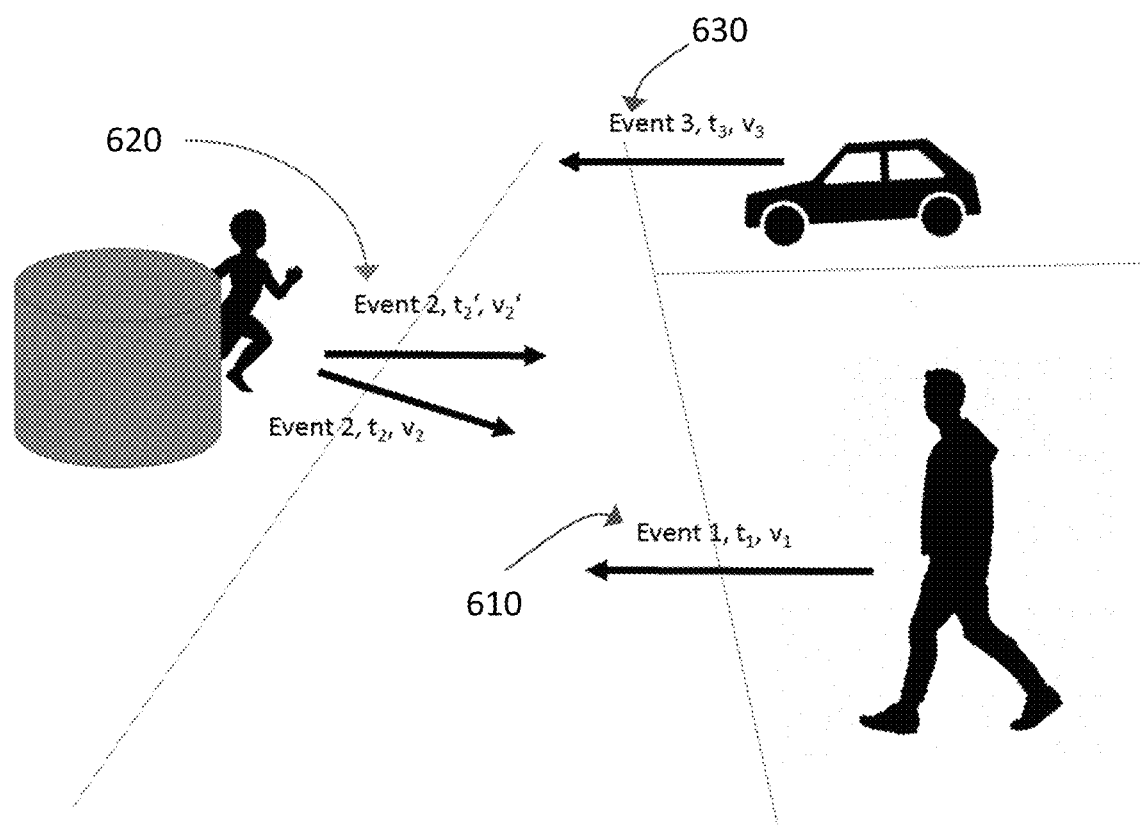
FIG. 6 illustrates exemplary simulation events in accordance with exemplary embodiments of the present disclosure.

By way of example, FIG. 6 depicts an exemplary simulation to be implemented including three sequential events. In FIG. 6, a simulated car when traveling along a defined path or way may encounter various dynamic or moving objects. In FIG. 6, the simulated vehicle may meet or encounter, a first event 610, a pedestrian, then a second event 620, a child, and after that a third event, 630, a motor vehicle. Each of these events may be scheduled or defined by data. For example, the first event 610 may be scheduled or defined to occur at a specified time ($t_1$) with a velocity ($v_1$). The second event 620 may be defined to occur after the first event. However, this time event may include variations of parameters. In the example of FIG. 6, the second event may be defined with variations of the time parameter. That is the second event may be defined to be simulated at a plurality of times (e.g., $t_2$, $t_2'$, etc.), each time with a respective velocity ($v_2$, $v_2'$, etc.). Similarly, the third event may be defined by data to simulate at one or more times ($t_3$, etc.) with one or more velocity ($v_3$, etc.).

Figure 7:
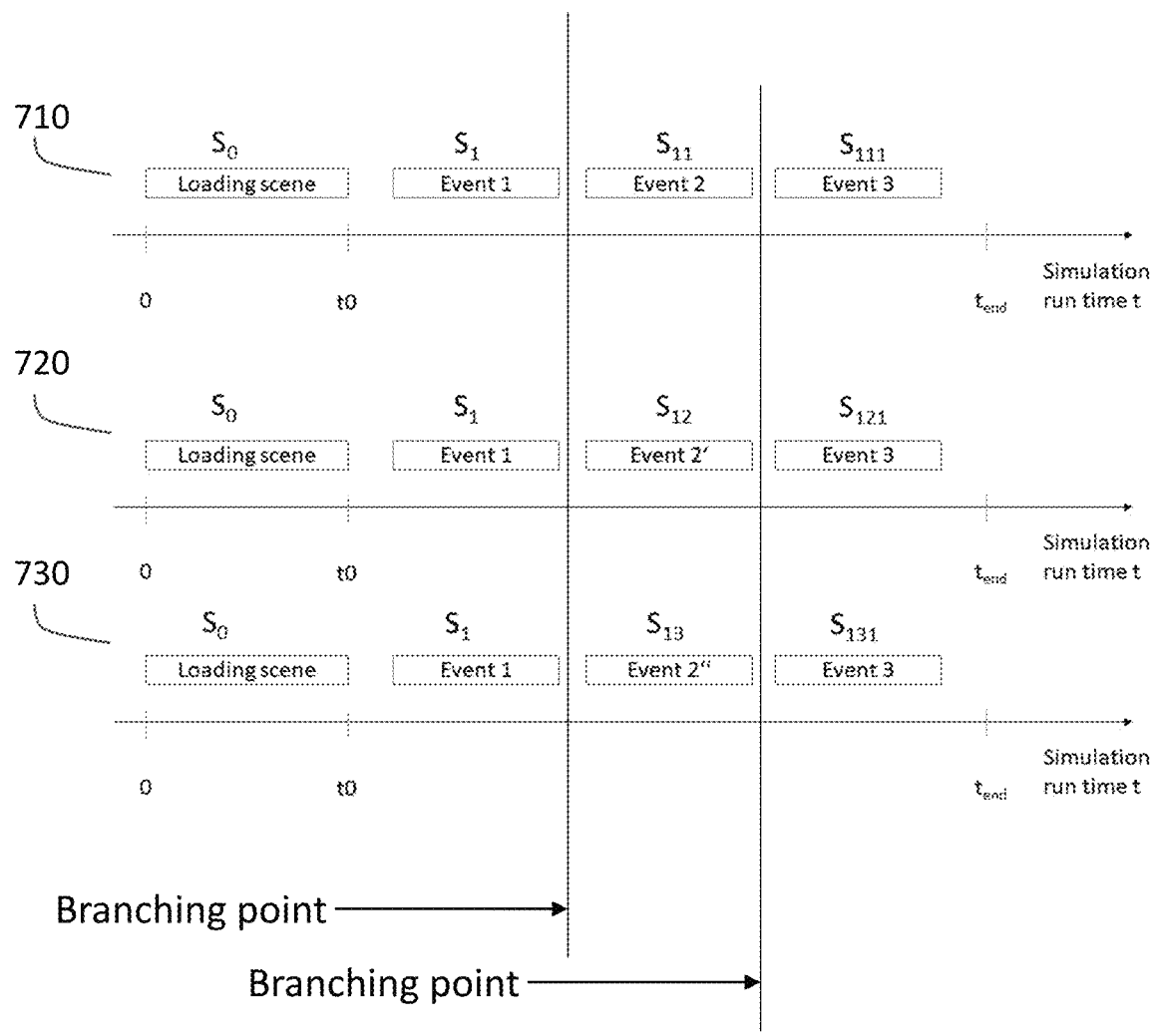
FIG. 7 illustrates exemplary time diagrams of the simulation events according to FIG. 6.

FIG. 7, shows an exemplary time event diagram depicting exemplary simulation session segments or instances corresponding to the simulation time events of FIG. 6. The simulation path 710 is a simulation session including a series of events, namely $S_0$, $S_1$, $S_{11}$, $S_{111}$. Similarly, the simulation path 720 is a simulation session including a series or sequence of events, namely $S_0$, $S_1$, $S_{11}$, $S_{111}$, and the simulation path 730 is a simulation session including a series of events, namely $S_0$, $S_1$, $S_{13}$, $S_{131}$. FIG. 7 shows one approach to simulating the actions or events of FIG. 6 using with three separate simulation sessions beginning from the initial or loading scene $S_0$. As can be seen, such an approach may include redundant computations, namely the loading of the initial scene $S_0$, and the execution of simulation through event 1, $S_1$.

Therefore, as described or explained in connection with FIGS. 4 and 5, a graph-based approach may be utilized in exemplary embodiments. For example, a simulation may be executed, e.g., with the AD simulation system 300 (or any other suitable simulation system), and by loading the initial loading scene ($S_0$) and executing the simulation at least through the event 1 $S_1$.

Then, at a branching point, or a point before an event with multiple parameter variations is simulated, a copy of the simulation state is stored or saved for future use. The saved simulation state can be considered and stored as a node $S_1$, which can be associated with the completed first event. The simulation state corresponding to the $S_1$ node can be saved and linked with, now or in the future, with other nodes/ simulation states. In general, any node or simulation state may be suitably related or connected to one or more other nodes/simulation states.

In this case, after the current simulation state is saved as node $S_1$, at least one further simulation session can be executed. This separate or branched simulation session, "branched simulation 1" starts from the saved simulation session (node) at the branching point using one of the parameter configuration or variation associated with the branching event, which in this case is event 2 of FIG. 6. The simulation session may continue until another branching point, or an end point of the simulation is reached.

Figure 8:
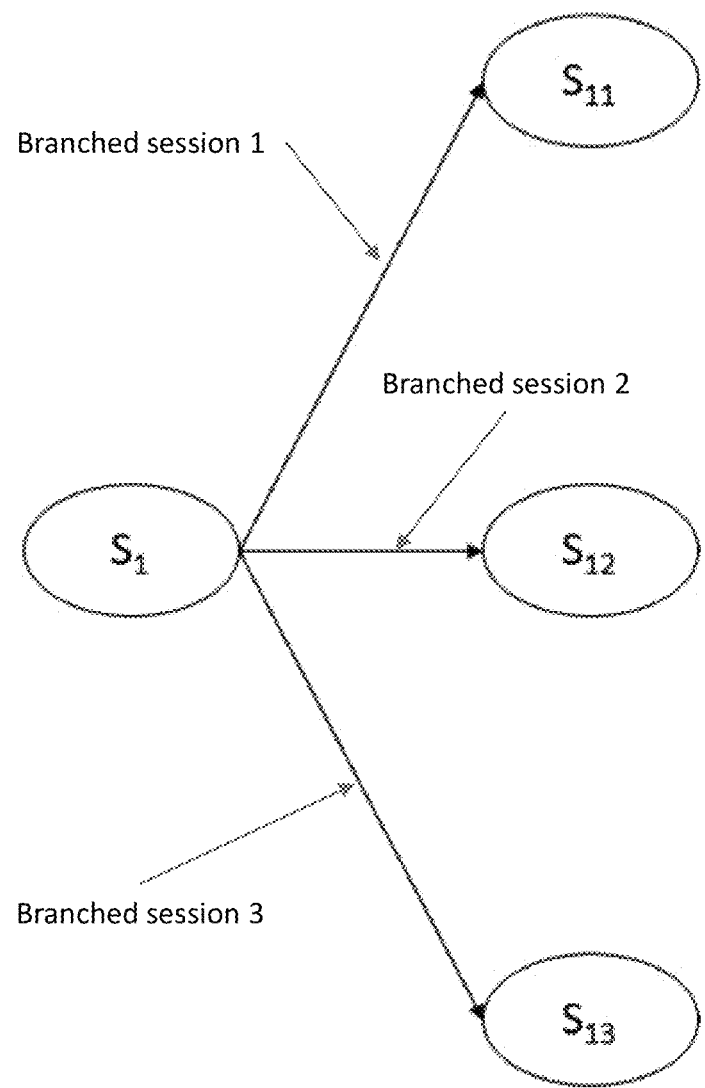
FIGS. 8-10 illustrate exemplary simulations stores as a graph structure in accordance with exemplary embodiments of the present disclosure.

In exemplary embodiments, additional simulation sessions are executed from the $S_1$ node. Each of the simulation sessions or instances beginning from $S_1$ can execute a respective or different parameter variation for event 2. For example, for the branched simulation 1, the "second" event 1 may be simulated using the parameter variation ($t_2$, $v_1$), whereas the second branched simulation session from $S_1$, "branched simulation 2" may be executed using the parameter variation ($t_2'$, $v_2'$). Similarly, a third branched simulation session from $S_1$, "branched simulation 3" may be executed using the parameter configuration or variation ($t_2''$, $v_2''$). That is, the number of branched simulation sessions executing from $S_1$ may depend on the total number of parameter variations for event 2. Branched simulation session 1, 2, and 3 are visually depicted in FIG. 8.

These additional branched simulations, i.e., branch simulation 2, branch simulation 3, etc. may execute after the simulation branched simulation 1 has ended or may, in some embodiments may execute at least partially with simulation branched simulation 1, depending on software and computation hardware suitability. As shown in FIG. 6, a third event may be scheduled to be simulated after event 2. This event 3 may also be branching event, e.g., an event with one or more parameter variations or may be an end event. Therefore, after the version of event 2 has been simulated and executed for each of the branched simulations (branch simulation 1, branch simulation 2, etc.) the simulation state for each is saved at a branching point, before event 3.

Figure 9:
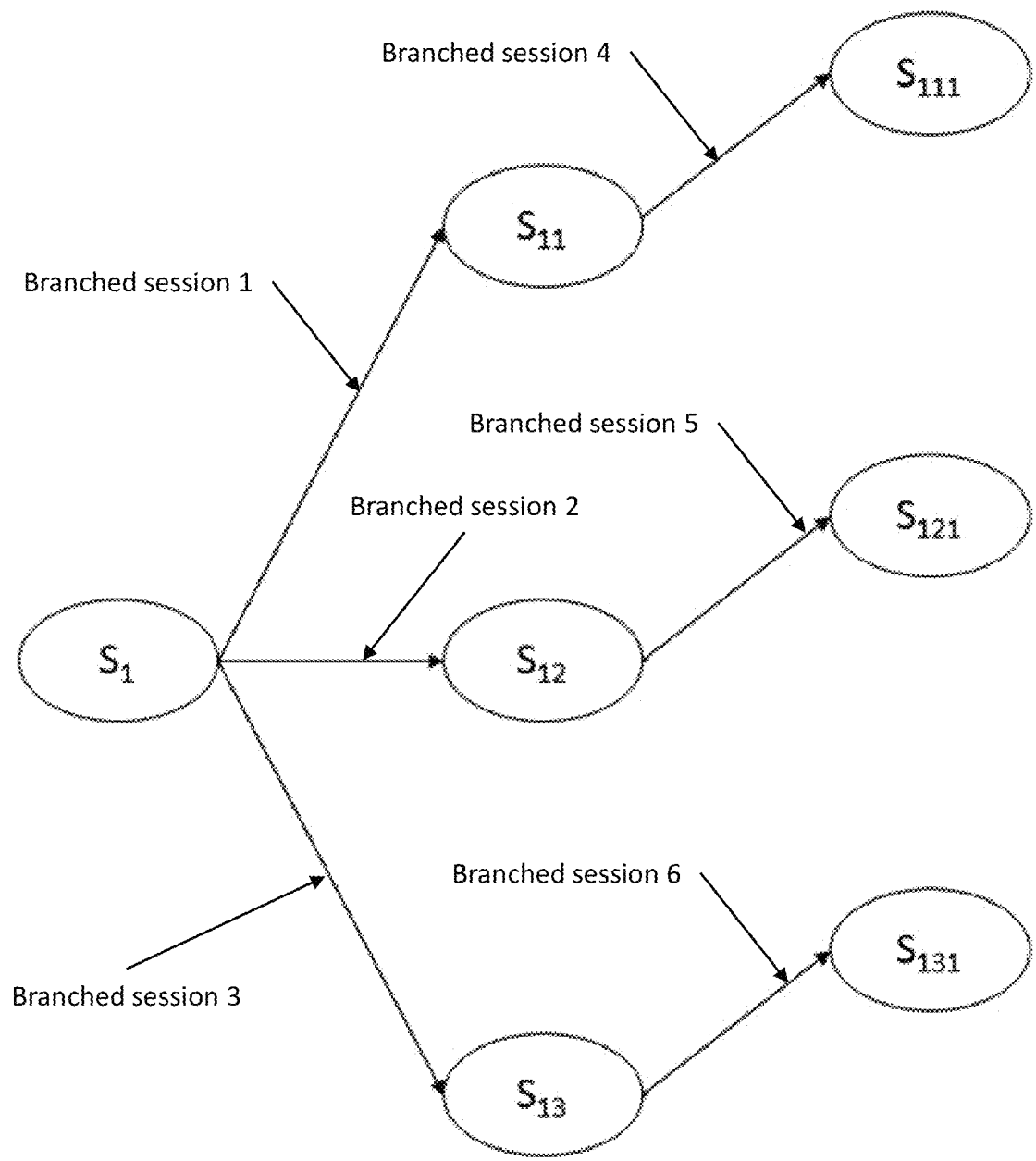

As shown in FIG. 9, the branched simulation sessions 4, 5, 6 are be executed respectively from the saved simulation points or graph nodes $S_{11}$, $S_{12}$, and $S_{13}$. These branched simulation sessions can lead to event 3 and nodes $S_{111}$, $S_{121}$, and $S_{131}$.

Figure 10:
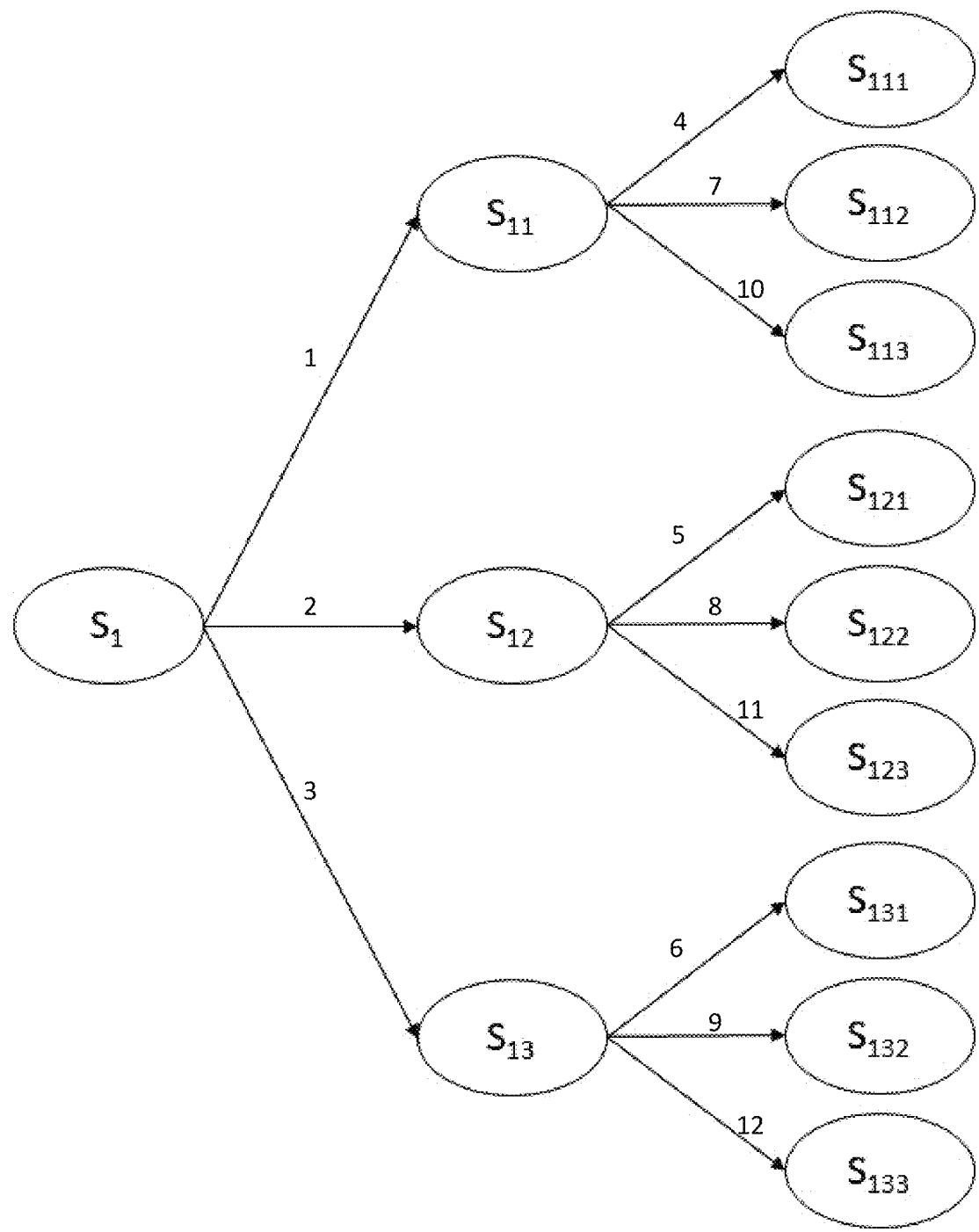

In in the embodiment of FIG. 6, event 3 may also have multiple parameter variations or configuration. In such a case, the event 3 will cause numerous simulation instances to be executed by a simulation session from each of nodes $S_{11}$, $S_{12}$, and $S_{13}$. FIG. 10 shows, according to an exemplary embodiment, where event 3 may be defined to have 3 variations of a parameter(s). Therefore, in embodiments, branched simulation sessions 7-10 executed (from nodes $S_{11}$, $S_{12}$, and $S_{13}$) and respectively simulating to graph nodes $S_{112}$, $S_{122}$, $S_{132}$, $S_{113}$, $S_{123}$, and $S_{133}$.

In accordance with exemplary embodiments, branched simulation segments, e.g., simulation instances and sessions may be executed in any suitable or efficient order. In various exemplary embodiments, the branched simulation segments may be executed in serial and/or in parallel on multiple machines, chips, and/or cores of chips.

In one example referring to FIG. 10, the branched simulation sessions 1-12, (merely labeled 1, 2, 3, 4 . . . 12 in FIG. 10) can be performed in various orders or sequences. In one example, the branched simulation sessions may be performed in the order 1, 2, 3, 4, 5, 6, 7, 8, 9, 10, 11, 12 or in the order 1, 4, 7, 10, 2, 5, 8, 11, 3, 6, 9, 12. Furthermore, depending upon a particular implementation, two or more of the branched simulation session can overlap or be executed concurrently.

In accordance with exemplary embodiments of the present disclosure, the saved simulation states may be linked or refer to at last one other node in a graph structure. Therefore, the simulation states may be traversed in any suitable manner. For example, a particular simulation state may be entered (e.g., loaded) and a simulation may be re-executed from that node or saved simulation state.

The linking and storage of simulation states in a graph or graph-like structure enable intelligent strategies to efficiently traverse the graph or reduce or eliminate computation execution of redundant simulation segments. That is a new simulation session can be implemented directly from one of the stored states, either automatically or in response to some user-defined input.

As such, to reduce the amount of search executed, nodes $(S_1, \ldots, S_n)$, various well-known computer algorithms used for pathfinding and graph traversal may be employed in the context described herein. One example would be the use of the A* ("A star") algorithm [, see below] that can significantly reduce the number of required search nodes under certain conditions. The A* algorithm finds (under certain assumptions) the minimum of a cost function without the need to expand all possible search nodes. (See Hart, P. E.; Nilsson, N. J.; Raphael, B. (1968). "*A Formal Basis for the Heuristic Determination of Minimum Cost Paths*". IEEE Transactions on Systems Science and Cybernetics SSC4.4 (2): 100-107.)

In the context of validation, the goal might not be to minimize a specific parameter configuration. Instead, it is intended to test all possible parameter variants. In this case, an A* algorithm would not be useful. However, the graph-based representation would allow intelligent search like importance sampling, giving more meaningful tests and combined with our techniques with significantly reduced computational effort.

In accordance with exemplary embodiments, a simulation system a KPI metric may be determined or calculated at various instances during a simulation or simulation session. For example, each time a simulation state is saved (e.g., a node is created and stored), one or more KPI metrics for that node may be determined for that saved simulation state. Further, in some exemplary embodiments, on the basis of the determined KPI metrics, the test data defining, such as test data defining the variations for one or more parameters may be altered or updated. In one example, if one or more KPI metrics indicate "good" or at least "satisfactory" results at the simulation state, it may not be necessary for a simulation to execute all the previously defined variations for one or more parameters. In other words, the test data may be changed to decrease or eliminate some parameter variations. On the other hand, the one or more KPI metric indicates "unsatisfactory" results at the simulation state it may be necessary to execute more variations for one or more parameters. In other words, the test data may be changed to decrease or eliminate some parameter variations.

In some exemplary embodiments described herein, an event may be considered with a branching event even if the time event only has one variation for each of the parameters therein. In this regard, the simulation state may be saved before the execution of the event. This may allow, at a future point, to modify the simulation or test data so as to add variations to one or more parameters and then run simulations using those parameter variations without having to start from the beginning of a simulation. That is, in exemplary embodiments, a future simulation session or instance can load from the branching point, e.g., before the branching time event, and execute the event with one or more parameter variations that did not previously exist.

In general, a simulation may be set-up using the same scene but with a number of variations of parameters, like time, speed and style of walking of a pedestrian crossing the road, etc. For each parameter, a sequence of variations can be created and tested. As additional objects are varied in the scene, then each variation sequence will increase the required tests by multiples (permutations). For example, with respect to FIG. 4, for example, it can be assumed that each event has a number of variations of parameters. A first event can have N variants, the second can have M variants, and the third event can have L variants. This can be extended for any number of event.

Consequently, the computational effort (like in CPU execute time) of each segment can be C0 for the loading, C1 for the first segment, C2 for the second, etc. Thus, for the three events, a total computational effort to full brute force computation would be:

$$C_{total}=(C0+C1+C2+C3)*N*M*L$$

However, in accordance with embodiments described herein, the proposed approach the computational effort (without overhead) would be $$C_g=C0+N*C1+M*C2+L*C3$$

For the case of successive segments (e.g., as depicted in FIG. 6) an exemplary approach described herein reduces the computational effort from exponential (over branches) to a linear effort.

In another example, if 50 variations are computed for each event, i.e. N=M=L=50, and if it can be assumed that all segments and the loading phase requires the same computational effort C, i.e. C0=C1=C2=C3=C then we the following computational effort is realized:

$$C_{total}=500,000*C$$

$$C_g=151*C$$

This represents, in this example, a saving of a factor 3311. These estimations do not take overheads into account, which are the costs to save the simulation state and represents additional CPU and in particular disk and/or memory load.

If only one event with different variants is considered, then for N=50

$$C_{total}=100*C$$

$$C_g=51*C$$

which results in a saving factor of around 2.

The following examples pertain to further exemplary implementations.

Example 1, in accordance with exemplary embodiments of the present disclosure, includes a method for simulating autonomous driving, the method including obtaining at an autonomous driving (AD) simulation system that includes one or more processors operatively coupled to one another, scenario simulation data and simulation test data, the simulation test data defining a plurality of segmented time events; executing, by the AD simulation system, an initial simulation session sequentially from a starting point defined by the obtained scenario simulation data and simulation data test; detecting, by the AD simulation system, a branching point, the branching point occurring in the initial simulation session before execution of a branching time event that includes a parameter having a plurality of discrete variations, storing, before execution of the detected branching time event, a current state of the initial simulation session as a parent graph node; and executing, by the AD simulation system, a separate first branched simulation session starting from the stored current state of the initial simulation using a first variation of the plurality of the discrete variations for the parameter of the branching time event.

In Example 2, the subject matter of Example 1 can further include, after the AD simulation system executes the branching time event with the first variation in the first branched simulation session, the AD simulation system storing a further current state of simulation as a child node linked with the parent node.

In Example 3, the subject matter of Example 1 or 2 can further include executing, by the AD simulation system, a second separate branched simulation session starting from the stored parent node using a second variation of the plurality of the discrete variations of a parameter for the branching time event, the second variation being different from the first variation.

In Example 4, the subject matter of Example 3 can optionally further include, after the simulation executes the branching time event with the second variation in the second branched session, the AD simulation system storing a further current state of simulation as a further child node linked with the parent node.

In Example 5, the subject matter of Example 3 or 4 can optionally further include, wherein the second separate branched simulation session is executed in parallel with the first branched simulation session.

In Example 6, the subject matter of Example 3 or 4 can optionally further include, wherein the second separate branched simulation session is executed partially in parallel with the first branched simulation session.

In Example 7, the subject matter of Example 3 or 4 can optionally further include, wherein the second separate branched simulation session is executed after the first branched simulation session.

In Example 8, the subject matter of any of Examples 1 to 7 can optionally further include wherein the branched simulation session is executed using an OS fork operation.

In Example 9, the subject matter of any of Examples 1 to 7 can optionally further include wherein the AD simulation system is configured to implement a virtual machine that is configured to execute simulation sessions.

In Example 10, the subject matter of any of Examples 1 to 7 can optionally further include wherein the AD simulation system is configured to implement simulation sessions in one or more containers or container data structures.

In Example 11, the subject matter of any of Examples 1 to 10 can optionally further include determining by the AD simulation system, one or more key performance indicators (KPI) metrics associated with the further stored current state of the initial simulation session; and modifying, by the AD simulation system, the plurality of the discrete variations for the parameter of the branching time event.

In Example 12, the subject matter of Example 11 can optionally further include removing at least one of the plurality of discrete variations for the parameter of the branching time event.

In Example 13, the subject matter of Example 11 can optionally further include adding a variation to the plurality of discrete variations for the parameter of the branching time event.

Example 14 can include, in accordance with exemplary embodiments of the present disclosure, a method for executing simulated autonomous driving including: obtaining at an autonomous driving (AD) simulation system comprising one or more processors operatively coupled to one another, a simulation state, the simulation state stored as node linking to one or more other AD simulation states stored as nodes; executing, by the AD simulation system, a simulation session from the obtained simulation state; detecting, by the AD simulation system, a branching point, the branching point occurring in the current simulation session before execution of a branching time event including a parameter having a plurality of discrete variations, storing, by the AD simulation system, before execution of the detected branching time event, a current state of the current simulation session as a graph node linked with the obtained simulation state; determining, by the AD simulation system, a next simulation state from which to execute a further simulation session; obtaining, by the AD simulation system, the simulation state at the determined graph node, the simulation state including a branching time event with a plurality of variations of a parameter; executing, by the AD simulation system, a further simulation session from the determined simulation state using a selected parameter variation from one or more parameter variations.

In Example 15, the subject matter of Example 14 can further include that each simulation state includes scenario simulation data and simulation test data, the simulation test data defining a plurality of segmented time events.

In Example 16, the subject matter of Examples 14 or 15 can further include that the selected parameter variation includes a parameter variation not previously executed by the AD simulation system.

In Example 17, the subject matter of Examples 14 to 16 can further include executing, by the AD simulation system, a second further simulation session from the determined simulation state using a second selected parameter variation from one or more parameter variations.

In Example 18, the subject matter of Example 17, wherein the second selected parameter variation includes a parameter variation not previously executed by the AD simulation system.

In Example 19, the subject matter of Example 17 or 18, can further include executing the second further simulation in parallel with the further simulation session.

In Example 20, the subject matter of Example 17 or 18 can further include executing the second further simulation session partially in parallel with the first branched simulation session.

In Example 21, the subject matter of Example 17 or 18 can further include executing the second further simulation session after execution of the first branched simulation session.

In Example 22, the subject matter of any of Examples 14 to 21 may further include detecting, by the AD simulation system, a further branching point, the branching point occurring in the now current AD simulation session before execution of a branching time event including a parameter having a plurality of discrete variations; storing, by the AD simulation system, before execution of the detected branching time event, a current state of the current simulation session as a graph node linked with the obtained simulation state; determining, by the AD simulation system, another graph node from which to execute a further simulation session; obtaining, by the AD simulation system, the simulation state at the determined another graph node, the simulation state including a branching time event with a plurality of variations of a parameter; executing, by the AD simulation system, another AD simulation session from the determined another simulation state using a selected parameter variation from one or more parameter variations.

In Example 23, the subject matter of any of Examples 14-22, wherein the AD simulation system determines the another simulation state based on a graph traversal algorithm.

In Example 24, the subject matter of any of Examples 14-23, wherein the further AD simulation session is executed using an OS fork operation.

In Example 25, the subject matter of any of Examples 14-24, wherein the AD simulation system is configured to implement a virtual machine, configured to execute AD simulation sessions.

In Example 26, the subject matter of any of Examples 14-15, can further include determining, by the AD simulation system, one or more KPI metrics for the current simulation state; and modifying, by the AD simulation, data defining a plurality of parameter variations for a simulation state previous to the current simulation state based on the determined KPI metrics for the current simulation state.

Example 27 can include, in accordance with exemplary embodiments of the present disclosure, an autonomous driving (AD) simulation system that may include: one or more processors and at least a memory storing instructions that, when executed by the one or more processors, cause the one or more processors to: obtain a stored AD simulation state, the simulation state stored as a graph node linked to one or more other simulation states stored as other graph nodes; execute a current AD simulation session from the obtained simulation state; detect a branching point, the branching point occurring in the current AD simulation session before execution of a branching time event including a parameter having a plurality of discrete variations, store, before execution of the detected branching time event, a current state of the current simulation session as a graph node linked with the obtained simulation state; determine a next simulation state from which to execute another simulation session; obtain the simulation state at the determined graph node, the simulation state including a branching time event with a plurality of variations of a parameter; execute, a further AD simulation session from the determined simulation state using a selected parameter variation.

Example 28, the subject matter of Example 27, wherein each simulation state can include scenario simulation data and simulation test data, the simulation test data defining a plurality of segmented time events.

Example 29, the subject matter of Example 28 or Example 27, wherein the selected parameter variation can include a parameter variation not previously executed by the AD simulation system.

In Example 30, the subject matter of Examples 27 to 29, the one or more processors further caused to execute a second further simulation session from the determined simulation state using a second selected parameter variation from a plurality of parameter variations.

In Example 31, the subject matter of Example 30, wherein the second selected parameter variation includes a parameter variation not previously executed.

In Example 32, the subject matter of Examples 30 or 31, can further include the one or more processors caused to execute the second further simulation in parallel with the further simulation session.

In Example 33, the subject matter of Examples 30 or 31 can further include the one or more processors caused to execute the second further simulation session partially in parallel with the first branched simulation session.

In Example 34, the subject matter of Examples 30 or 31 can further include the one or more processors caused to execute the second further simulation session after execution of the first branched simulation session.

In Example 35, the subject matter of any of Examples 27-34, wherein the instructions that, when executed by the one or more processors, can further cause the one or more processors to detect a further branching point, the branching point occurring in the now current AD simulation session before execution of a branching time event including a parameter having a plurality of discrete variations; store, before execution of the detected branching time event, a current state of the current simulation session as a graph node linked with the obtained simulation state; determine another graph node from which to execute a further simulation session; obtain the simulation state at the determined another graph node, the simulation state including a branching time event with a plurality of variations of a parameter; and execute another AD simulation session from the determined another simulation state using a selected parameter variation.

In Example 36, the subject matter of any of Examples 27-35, wherein the instructions can cause the one or more processors of the AD simulation system to determine the another simulation state based on a graph traversal algorithm.

In Example 37, the subject matter of any of Examples 27-36, wherein the instructions can cause the one or more processors of the AD simulation system to execute the further AD simulation using an OS fork operation.

In Example 38, the subject matter of any of Examples 27-36, wherein the instructions can cause the one or more processors of the AD simulation system to implement a virtual machine configured to execute AD simulation sessions.

In Example 39, the subject matter of any of Examples 27-38, wherein the instructions that, when executed by the one or more processors, can further cause the one or more processors to determine one or more KPI metrics for the current simulation state; and modify data defining a plurality of parameter variations for a simulation state previous to the current simulation state based on the determined KPI metrics for the current simulation state.

It should be noted that one or more of the features of any of the examples above may be combined with any one of the other examples. It is appreciated that implementations of methods detailed herein are exemplary in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A method for simulating autonomous driving, the method comprising:
obtaining at an autonomous driving (AD) simulation system comprising one or more processors operatively coupled to one another, scenario simulation data and simulation test data, the simulation test data defining a plurality of segmented time events;

executing, by the AD simulation system, an initial simulation session sequentially from a starting point defined by the obtained scenario simulation data and simulation data test;

detecting, by the AD simulation system, a branching point, the branching point occurring in the initial simulation session before execution of a branching time event that includes a parameter having a plurality of discrete variations, storing, before execution of the detected branching time event, a current state of the initial simulation session as a parent graph node; and executing, by the AD simulation system, a separate branched simulation session starting from the stored current state of the initial simulation using a first variation of the plurality of the discrete variations for the parameter of the branching time event.

2. The method of claim 1, further comprising wherein after the AD simulation system executes the branching time event with the first variation in the branched simulation session, the AD simulation system stores a further current state of simulation as a child node linked with the parent node.

3. The method of claim 1, further comprising:
executing, by the AD simulation system, a second separate branched simulation session starting from the stored parent node using a second variation of the plurality of the discrete variations of a parameter for the branching time event, the second variation being different from the first variation.

4. The method of claim 3, wherein after the simulation executes the branching time event with the second variation in the second branched session, the AD simulation system stores a further current state of simulation as a further child node linked with the parent node.

5. The method of claim 1, wherein the branched simulation session is executed using an OS fork operation.

6. The method of claim 1, wherein the AD simulation system is configured to implement a virtual machine, configured to execute simulation sessions.

7. The method of claim 1, wherein the AD simulation system is configured to implement simulation sessions in one or more containers.

8. The method of claim 2, further comprising:
determining by the AD simulation system, one or more key performance indicator (KPI) metrics associated with the further stored current state of the initial simulation session; and
modifying, by the AD simulation system, the plurality of the discrete variations for the parameter of the branching time event.

9. The method of claim 8, further comprising, removing at least one of the plurality of discrete variations for the parameter of the branching time event.

10. The method of claim 8, further comprising, add a variation to the plurality of discrete variations for the parameter of the branching time event.

11. A method for executing simulated autonomous driving, the method comprising:
obtaining, at an autonomous driving (AD) simulation system comprising one or more processors operatively coupled to one another, a simulation state, the simulation state stored as node linking to one or more other AD simulation states stored as nodes;

executing, by the AD simulation system, a simulation session from the obtained simulation state;

detecting, by the AD simulation system, a branching point, the branching point occurring in the current simulation session before execution of a branching time event including a parameter having a plurality of discrete variations, storing, by the AD simulation system, before execution of the detected branching time event, a current state of the current simulation session as a graph node linked with the obtained simulation state;

determining, by the AD simulation system, a next simulation state from which to execute a further simulation session;

obtaining, by the AD simulation system, the simulation state at the determined graph node, the simulation state including a branching time event with a plurality of variations of a parameter;

executing, by the AD simulation system, a further simulation session from the determined simulation state using a selected parameter variation.

12. The method of claim 11, wherein each simulation state comprises scenario simulation data and simulation test data, the simulation test data defining a plurality of segmented time events.

13. The method of claim 12, wherein the selected parameter variation comprises a parameter variation not previously executed by the AD simulation system.

14. The method of claim 13, further comprising:
detecting, by the AD simulation system, a further branching point, the branching point occurring in the now current AD simulation session before execution of a branching time event including a parameter having a plurality of discrete variations;

storing, by the AD simulation system, before execution of the detected branching time event, a current state of the current simulation session as a graph node linked with the obtained simulation state;

determining, by the AD simulation system, another graph node from which to execute a further simulation session;

obtaining, by the AD simulation system, the simulation state at the determined another graph node, the simulation state including a branching time event with a plurality of variations of a parameter;

executing, by the AD simulation system, another AD simulation session from the determined another simulation state using a selected parameter variation.

15. The method of claim 14, wherein the AD simulation system determines the another simulation state based on a graph traversal algorithm.

16. The method of claim 11, wherein the further AD simulation session is executed using an OS fork operation.

17. The method of claim 11, wherein the AD simulation system is configured to implement a virtual machine, configured to execute AD simulation sessions.

18. The method of claim 11, further comprising:
determining, by the AD simulation system, one or more KPI metrics for the current simulation state; and
modifying, by the AD simulation, data defining a plurality of parameter variations for a simulation state previous to the current simulation state based on the determined KPI metrics for the current simulation state.

19. An autonomous driving (AD) simulation system, comprising:

one or more processors and a memory storing instructions that, when executed by the one or more processors, cause the one or more processors to:
- obtain a stored AD simulation state, the simulation state stored as a graph node linked to one or more other simulation states stored as other graph nodes;
- execute a current AD simulation session from the obtained simulation state;
- detect a branching point, the branching point occurring in the current AD simulation session before execution of a branching time event including a parameter having a plurality of discrete variations,
- store, before execution of the detected branching time event, a current state of the current simulation session as a graph node linked with the obtained simulation state;
- determine a next simulation state from which to execute another simulation session;
- obtain the simulation state at the determined graph node, the simulation state including a branching time event with a plurality of variations of a parameter;
execute a further AD simulation session from the determined simulation state using a selected parameter variation.

\* \* \* \* \*